(12) United States Patent
Wang et al.

(10) Patent No.: US 8,060,796 B2
(45) Date of Patent: Nov. 15, 2011

(54) MULTIPLEXING METHOD AND APPARATUS THEREOF FOR DATA SWITCHING

(75) Inventors: Chung-Hsuan Wang, Hsinchu (TW); Shuenn-Gi Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1081 days.

(21) Appl. No.: 11/864,992

(22) Filed: Sep. 29, 2007

(65) Prior Publication Data

US 2009/0016352 A1    Jan. 15, 2009

(30) Foreign Application Priority Data

Jul. 10, 2007 (TW) ................................ 96125018 A

(51) Int. Cl.
*G06F 11/00* (2006.01)
(52) U.S. Cl. ........................................ 714/704; 714/790
(58) Field of Classification Search .................. 714/704, 714/752, 790
See application file for complete search history.

(56) References Cited

U.S. PATENT DOCUMENTS

| | | | | | |
|---|---|---|---|---|---|
| 5,883,899 | A | * | 3/1999 | Dahlman et al. | 370/468 |
| 6,158,041 | A | * | 12/2000 | Raleigh et al. | 714/792 |
| 6,233,713 | B1 | * | 5/2001 | Van Den Berghe et al. | 714/790 |
| 6,275,480 | B1 | * | 8/2001 | Schreier | 370/321 |
| 6,622,281 | B1 | * | 9/2003 | Yun et al. | 714/790 |
| 7,027,518 | B2 | * | 4/2006 | Mikkola et al. | 375/259 |
| 7,404,138 | B2 | * | 7/2008 | Kim et al. | 714/776 |
| 7,778,197 | B2 | * | 8/2010 | Kim | 370/252 |

\* cited by examiner

*Primary Examiner* — Esaw Abraham
(74) *Attorney, Agent, or Firm* — Jianq Chyun IP Office

(57) ABSTRACT

A multiplexing method for data switching is disclosed. In the method, a continuous data is received, and the continuous data includes a plurality of super frames, and each super frame includes a plurality of frames. These super frames are divided into a set of even super frames and a set of odd super frames. The frames included in the set of odd super frames are sorted by corresponding required bit error rate of each frame decreasingly or increasingly. The frames included in the set of even super frames are sorted by the required bit error rate of each frame increasingly or decreasingly. An encoder is used to encode these sorted super frames.

17 Claims, 7 Drawing Sheets

MULTIPLEXING METHOD AND APPARATUS THEREOF FOR DATA SWITCHING

CROSS-REFERENCE TO RELATED APPLICATION

This application claims the priority benefit of Taiwan application serial no. 96125018, filed Jul. 10, 2007. All disclosure of the Taiwan application is incorporated herein by reference.

BACKGROUND OF THE INVENTION

1. Field of the Invention

The present invention relates to a multiplexing method and apparatus thereof for data switching. More particularly, the present invention relates to a multiplexing method and apparatus thereof for data switching, which include arrangement of frames in super frames and table switching.

2. Description of Related Art

With development of network switching technology and increase of network bandwidth, an Internet service provider (ISP) may provide more different types of network services. In a former network with limited bandwidth, only text data or voice data can be transmitted. In now days, with increase of network bandwidth, image data or video data can be transmitted on network. However, different bit error rates (BERs) are required for transmitting the aforementioned different data. For example, a low BER is required for transmitting the image data so as to obtain a relatively clear image, and a relatively high BER is allowed while transmitting the voice data, since a user may just care about identification of the voice, not clearness or elegancy of the voice.

An error correction code for protecting a transmitting data may achieve its error correction function by adding additional bits to the transmitting data. The more the additional bits added, the better effect the error correction is, i.e. the better error correction effect the error correction code achieves, and the lower BER the transmitting data has. Therefore, application of a same error correction code having better error correction ability for the transmitting data requiring different BERs may significantly decrease a transmission rate. However, if a same error correction code having lower error correction ability is applied for protecting the transmitting data requiring different BERs, although the transmission rate is not decreased greatly, transmission of the data requiring the lower BER cannot be satisfied.

Therefore, an unequal error protection (UEP) method is provided for protecting the transmitting data requiring different BERs. According to the method, different error correction codes with different qualities are applied to the transmitting data requiring different BERs, so as to meet the requirement of different BERs for different transmitting data without a great decrease of the transmission rate.

FIG. 1 is a circuit diagram illustrating a conventional multiplexing method for unequal error protection. As shown in FIG. 1, a continuous data is divided into four sequence codes SF1, SF2, SF3 and SF4, in which each of the sequence codes SF1~SFW represents a super frame. Each of the super frames SF1~SF4 includes a plurality of transmitting data S1, S2 . . . SW, and each of the transmitting data S1, S2 . . . SW represents a frame. A rate-compatible punctured code encoder 10 punctures each of the frames S1~SW to achieve the unequal error protection effect. Each of the frames S1~SW requires a different BER. If a relation of the BERs for the frames S1~SW within each of the super frame SF1~SF4 is PS1>PS2> . . . >PSW, the frames S1~SW within each super frame is then sorted as S1, S2 . . . SW.

In other words, frames S1~SW of each super frame SF1~SF4 are sorted according to a corresponding required BER of each of the frames S1~SW decreasingly or increasingly. Then, a string of bit codes padded with zeros is added to the tail of each of the super frames SF1~SF4 to meet a requirement of bit length of an input bit and avoid a mass of errors occurred in the UEP system due to utilization of a hard switching method (which will be described in the follows) by the rate-compatible punctured code encoder 10. However, in this data multiplexing method for UEP, since the frames of each super frame are sorted by its corresponding required BERs decreasingly or increasingly, unexpected errors may occur in the system due to excessive instant changes of the BERs when a receiving terminal performs decoding on the frames closely connected between two adjacent super frames. Meanwhile, adding of the string of bit codes may decrease an actual transmission rate and throughout rate (i.e. waste of bandwidth). Accordingly, transmission efficiency and bandwidth utilization of the UEP system are poor.

FIG. 2 is a diagram of bit error rates on a receiving terminal according to a conventional data multiplexing method for unequal error protection. As shown in FIG. 2, there is an instant increase of the BERs of the frames SW and S1 closely connected between two adjacent super frames, which will cause the unexpected errors of the UEP system. Accordingly, a protection efficiency of the UEP system is decreased.

FIG. 3 is a circuit diagram of a rate-compatible punctured code encoder 10. Referring to FIG. 3, the encoder 10 includes a convolution code encoder 101 and a puncturing unit 102. The encoder 10 encodes and punctures the frames S1~SW requiring different BERs to perform different degrees of protection on the frames S1~SW, such that the UEP effect is achieved. The relation of the required BERs of the frames S1~SW is PS1>PS2 . . . >PSW. The operation principle is as follows. First, the convolution code encoder 101 performs convolution encoding on the frames S1~SW and outputs an encoded data C_parent. Next, the puncturing unit 102 provides different puncturing tables T1, T2 . . . TW to the frames S1, S2 . . . SW requiring the different BERs. Finally, the encoded data C_parent is punctured according to the puncturing tables to form a punctured encoded data C_child.

For example, as to the frame S1, after the convolution code encoder 101 performs convolution encoding on the frames S1~SW and generates the encoded data C_parent, the puncturing unit 102 provides the corresponding puncturing table T1 to the frame S1. Then, the puncturing unit 102 starts to puncture the encoded data C_parent according to a start position of the puncturing table T1, and outputs the punctured encoded data C_child. During which if a bit code located at a certain position of the puncturing table T1 is 1, the puncturing unit 102 then outputs the encoded data C_parent located in a position corresponding to that in the puncturing table T1; and if the bit code located at a certain position of the puncturing table T1 is 0, the puncturing unit 102 then punctures the encoded data C_parent located in the position corresponding to that in the puncturing table T1.

Assuming the encoded data of the frame S1 after being convolution encoded is C_parent=[1 0 1 1 1; 0 0 0 1 1], and the puncturing unit 102 provides the puncturing table T1=[0 0 0 1 1; 1 0 1 1 1] to the frame S1. Then, the puncturing unit 102 starts to puncture the encoded data C_parent according to the start position of the puncturing table T1, and generates the punctured encoded data C_child=[x x x 1 1; 0 x 0 1 1], wherein x represents the data punctured, i.e. x will not be transmitted. Therefore, according to the above example, the data outputted by the puncturing unit 102 is 110011.

As described above, to achieve the UEP effect, and if the relation of the BERs required by the frames S1~SW is PS1>PS2 . . . >PSW, the puncturing unit 102 may sequentially provide the puncturing tables T1~TW to the corresponding frames S1~SW, wherein the relation of the puncturing tables T1~TW will be described as follows. If the bit code located at a certain position in the puncturing table T1 is 1, the bit codes located at the same positions of the puncturing tables T2~TW are also 1. If the bit code located at a certain position in the puncturing table T2 is 1, the bit codes located at the same positions of the puncturing tables T3~TW are also 1. The relations of the other puncturing tables may be deduced accordingly. For example, if the bit code located at a first column and a second row of the puncturing table T1 is 1, the bit code located at the first column and the second row of each of the puncturing tables T2~TW is also 1.

According to the aforementioned relation of the puncturing tables T1~TW, the number of bits punctured in the frames S1~SW has a relation of S1>S2> . . . >SW. Namely, protection degrees of the frames S1~SW provided by the encoder 10 have an order of S1<S2< . . . <SW. According to the different protection degrees of the frames S1~SW provided by the encoder 10, the error correction ability provided by the encoder 10 may satisfy the requirement of different BERs for the frames S1~SW, such that the UEP can be achieved.

Referring to FIG. 3 again, in the conventional UEP method, the puncturing unit 102 starts to perform the puncturing process on the encoded data C_parent according to the corresponding start positions of the puncturing tables. The puncturing unit 102 switches to a suitable puncturing table every time when the BER of the inputted frame changes to perform the puncturing process, wherein the puncturing processes of the encoded data C_parent are all started according to the start position of the corresponding puncturing table. This switching method is referred to as a hard switching method. However, the hard switching method may decrease the efficiency of the UEP and cause more errors on the data received by the receiver terminal, and therefore the BERs required by the frames S1~SW cannot be satisfied.

The reason why the hard switching method may decrease the efficiency of the UEP will be explained in the following examples. First, an example with no decrease of the UEP efficiency due to the hard switching method is provided, then, an example with decrease of the UEP efficiency due to the hard switching method is provided, so as to aid the explanation of why the rate-compatible punctured code encoder 10 using the hard switching method may decrease its UEP efficiency.

Assuming the encoded data of the frame S1 is [1 0 1 1 1; 0 0 0 1 1] after being convolution encoded by the convolution encoder 101, and the corresponding puncturing table T1 is [0 0 1 1; 0 1 1 1]; the encoded data of the frame S2 is [1 0 1 1 1; 0 0 0 1 1] after being convolution encoded by the convolution encoder 101, and the corresponding puncturing table T2 is [0 0 1 1 1; 1 0 1 1 1]. Then, the convolution encoder 101 encodes the frames S1 and S2, and generates the ecoded data C_parent=[1 0 1 1 1 0 1 1 1; 0 0 0 1 1 0 0 0 1 1]. The puncturing unit 102 starts to puncture the encoded data C_parent according to the start position of the puncturing table T1 until puncturing of the data located at 0~4 columns of the encoded data C_parent is completed. Next, the puncturing unit 102 starts to puncture the data located at 5~9 columns of the encoded data C_parent according to the start position of the puncturing table T2 until puncturing of the data located at 5~9 columns of the encoded data C_parent is completed. Finally, the puncturing unit 102 generates the punctured encoded data C_child=[x x x 1 1 x x 1 1 1; 0 x 0 1 1 0 x 0 1 1]. Now the hamming weight of the punctured encoded data C_child is 9, and the aforementioned hamming weight is the number of the bit codes having a value "1" within the encoded data. Great changes of the hamming weight may cause a great increasing of the BERs. However, in the present example, there is no decrease of the UEP efficiency due to the hard switching method.

However, if assuming the encoded data of the frame S1 is [1 0 1; 0 0 0] after being convolution encoded by the convolution encoder 101, and the corresponding puncturing table T1 is [0 0 0 1 1; 1 0 1 1 1]; the encoded data of the frame S2 is [1 1 1 0 1 1 1; 1 1 0 0 0 1 1] after being convolution encoded by the convolution encoder 101, and the corresponding puncturing table T2 is [0 0 1 1 1; 1 0 1 1 1]. Then, the convolution encoder 101 encodes the frames S1 and S2, and generates the encoded data C_parent=[1 0 1 1 1 1 0 1 1 1; 0 0 0 1 1 0 0 0 1 1]. Next, the puncturing unit 102 starts to puncture the data located at 0~2 columns of the encoded data C_parent according to the start position of the puncturing table T1. Namely, the data located at 0~2 columns of the encoded data C_parent are punctured according to the data located at 0~2 columns of the puncturing table T1. Then, the puncturing unit 102 starts to puncture the data located at 3~9 columns of the encoded data C_parent according to the start position of the puncturing table T2. However, the 3~9 columns of the encoded data C_parent include more columns than that included in the puncturing table T2. Therefore, the puncturing process is also started according to the start position of the puncturing table T2, until the end position of the puncturing table T2. In this case, some bits of the encoded data C_parent will be left un-punctured. Then, the puncturing process is restarted according to the start position of the puncturing table T2 until puncturing of the C_parent is completed.

In other words, the puncturing unit 102 first punctures the data located at 3~7 columns of the encoded data C_parent according to the data located at 0~4 columns of the puncturing table T2. Then, the data located at 8~9 columns of the encoded data C_parent are punctured according to the data located at 0~1 columns of the puncturing table T2. Finally, the puncturing unit 102 generates the punctured encoded data C_child=[x x x x x 1 0 1 x x; 0 x 0 1 x 0 0 0 1 x]. However, in this case, the hamming weight of the punctured encoded data C_child is 4. Therefore, the efficiency of the encoder 10 using the hard switching method may be decreased due to variation of the hamming weight, and the UEP efficiency of the encoder 10 is decreased accordingly. Moreover, another undesirable phenomenon shown in this example is that the punctured bits are excessively concentrated, which may easily cause decoding errors of a decoder. In summary, the UEP efficiency of the encoder 10 using the hard switching method is decreased. Therefore, the encoder 10 using the hard switching method cannot satisfy the requirement of different BERs of the frames S1~SW.

Therefore, based on the aforementioned description, the algorithm of the hard switching method may be represented by:

C_parent$_{i,t}$ is allowed for transmission as $T_{i,(t-tk) \bmod p}(k)=1$;

C_parent$_{i,t}$ is deleted from encoder outputs as $T_{i,(t-tk) \bmod p}(k)=0$;

for any t in the range between tk and tk'

Wherein tk represents the end position of a (k−1)-th puncturing table plus 1. $T_{i,j}(k)$ represents the bit code located at i-th row and j-th column in a k-th puncturing table, and the number of the total columns of the k-th puncturing table is p. tk' represents a k-th frame is ended on a tk'-th column of the C_parent. C_parent$_{i,t}$ represents the encoded data located at the i-th row and t-th colomn. If the bit code located at the i-th row and (t−tk mod p)-th column of the puncturing table is 1, data located at i-th row and t-th column of the encoded data C_parent can be transmitted. If the bit code located at the i-th row and (t-tk mod p)-th column of the puncturing table is 0, data located at i-th row and t-th column of the encoded data C_parent is punctured.

Though the encoder using the hard switching method may add a string of bit codes padded with zeros to each of the encoded data to avoid decrease of the UEP efficiency due to utilization of the hard switching method. However, adding of the string of the bit codes may decrease a transmission rate and a throughout rate of the system.

In summary, arrangement of the super frames of the conventional data multiplexing method for UEP has a shortage of excessive instant increasing or decreasing of the BERs of the frames between two adjacent super frames, which will cause unexpected errors in the system. Though a string of bit codes padded with zeros may be added to the tail of each of the super frames to meet the requirement of bit length of an input bit and avoid a mass of errors occurred in the UEP system due to utilization of the hard switching method, adding of the string of bit codes may also cause a waste of the system bandwidth and a decrease of the transmission rate. Moreover, application of the hard switching method by the puncturing unit of a conventional UEP system may greatly decrease the hamming weight of the punctured encoded data on the junction of the super frames, and cause a poor UEP effect. Though a string of bit codes padded with zeros may be added to each of the encoded data to increase the UEP efficiency, it may also cause a waste of the system bandwidth and a decrease of the transmission rate. Accordingly, the present invention provides a multiplexing method and apparatus thereof for data switching, such that the UEP efficiency can be improved, and waste of the system bandwidth can be avoided.

SUMMARY OF THE INVENTION

The present invention is directed to a multiplexing method and apparatus thereof for data switching, which may be applied to an unequal error protection (UEP) system. The method provided by the present invention has a better error protection effect compared with that of a conventional method, and the method is different from the conventional method which sacrifices a system bandwidth for improving the error protection effect.

The present invention provides a multiplexing method for data switching. In the method, a continuous data is received, and the continuous data includes a plurality of sequence codes, the plurality of sequence codes may be, for example, a plurality of super frames, and each super frame includes a plurality of frames. These super frames are divided into a plurality of odd super frames and a plurality of even super frames. The frames included in each odd super frame are sorted by corresponding required bit error rate (BER) of each frame decreasingly or increasingly. The frames included in each even super frame are sorted by the required BER of each frame increasingly or decreasingly. An encoder is used to encode these sorted super frames.

In the aforementioned method, if the frames included in each odd super frame are sorted by corresponding required BER of each frame decreasingly, the frames included in each even super frame are then sorted by the required BER of each frame increasingly. If the frames included each odd super frame are sorted by corresponding required BER of each frame increasingly, the frames included in each even super frame are then sorted by the required BER of each frame decreasingly.

The present invention provides a multiplexing apparatus for data switching. The apparatus includes an input terminal, a divider and an arbiter. The input terminal is used for inputting a continuous data including a plurality of super frames, wherein each super frame includes a plurality of frames. The divider is used for dividing the super frames into a plurality of even super frames and a plurality of odd super frames. The arbiter sorts the frames included in each odd super frame according to the corresponding required BER of each frame decreasingly, and sorts the frames included in each even super frame according to the required BER of each frame increasingly.

In an embodiment of the present invention, the aforementioned apparatus for data switching includes an encoder and a puncturing unit. The encoder is used for encoding the super frames sorted by the multiplexing apparatus. The puncturing unit is coupled to the encoder and is used for puncturing the encoded frames to meet the requirement of different coding rate.

Owning to the aforementioned method, waste of system bandwidth and decrease of transmission rate can be avoided, meanwhile, sudden change of the BERs of the frames at the junction of the super frames can also be avoided. The main reason is that the punctured bits will not be excessively concentrated, and therefore decreasing of decoding efficiency of a decoder can be mitigated. Moreover, according to the switching method of the present invention, great decreasing of the hamming weight of the punctured encoded data can be avoided, and therefore the unequal error protection (UEP) effect of the switching method of the present invention is better than that of a conventional method.

Since the present invention applies the aforementioned multiplexing method for data switching, sudden decreasing of the BERs of the frames between two super frames and unexpected errors occurred in a system due to utilization of the conventional multiplexing method can be avoid. Meanwhile, it is unnecessary to add a string of bit codes padded with zeros to the tail of each of the super frames, such that unnecessary waste of bandwidth is also avoided.

In order to make the aforementioned and other features and advantages of the present invention comprehensible, a preferred embodiment accompanied with figures is described in detail below.

DESCRIPTION OF EMBODIMENTS

Figure 1:
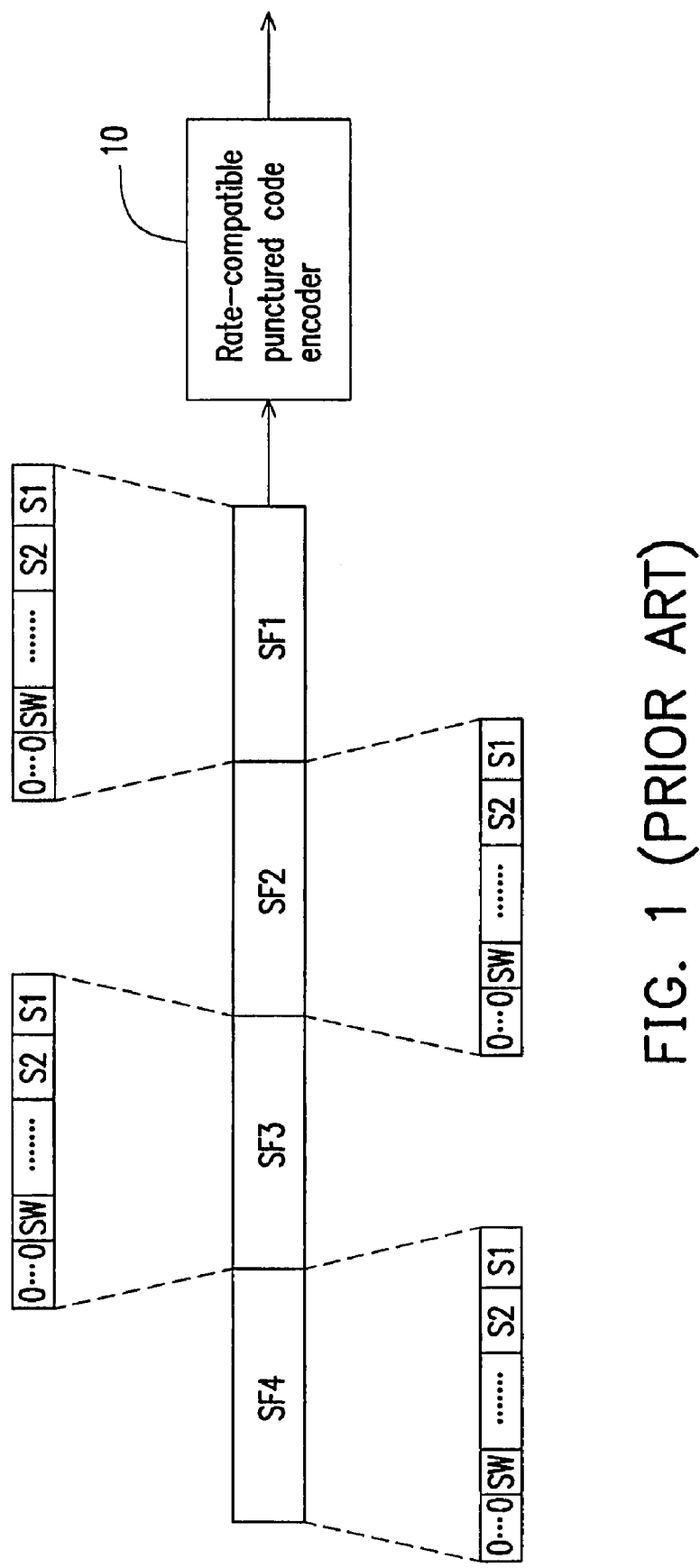
FIG. 1 is a circuit diagram illustrating a conventional multiplexing method for unequal error protection.
Figure 2:
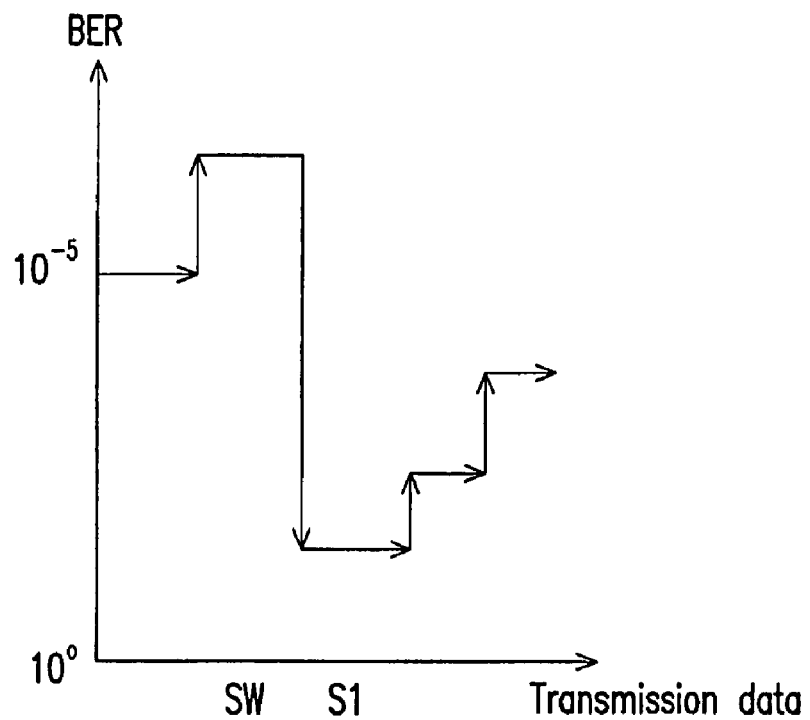
FIG. 2 is a diagram of bit error rates on a receiving terminal according to a conventional data multiplexing method for unequal error protection.
Figure 3:
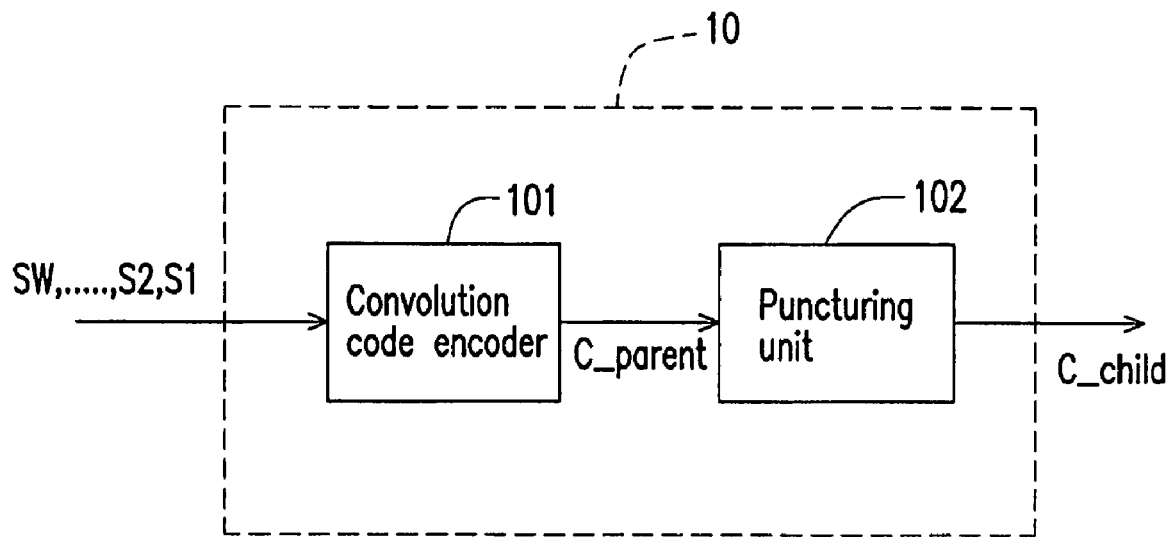
FIG. 3 is a circuit diagram of a conventional rate-compatible punctured code encoder.
Figure 4:
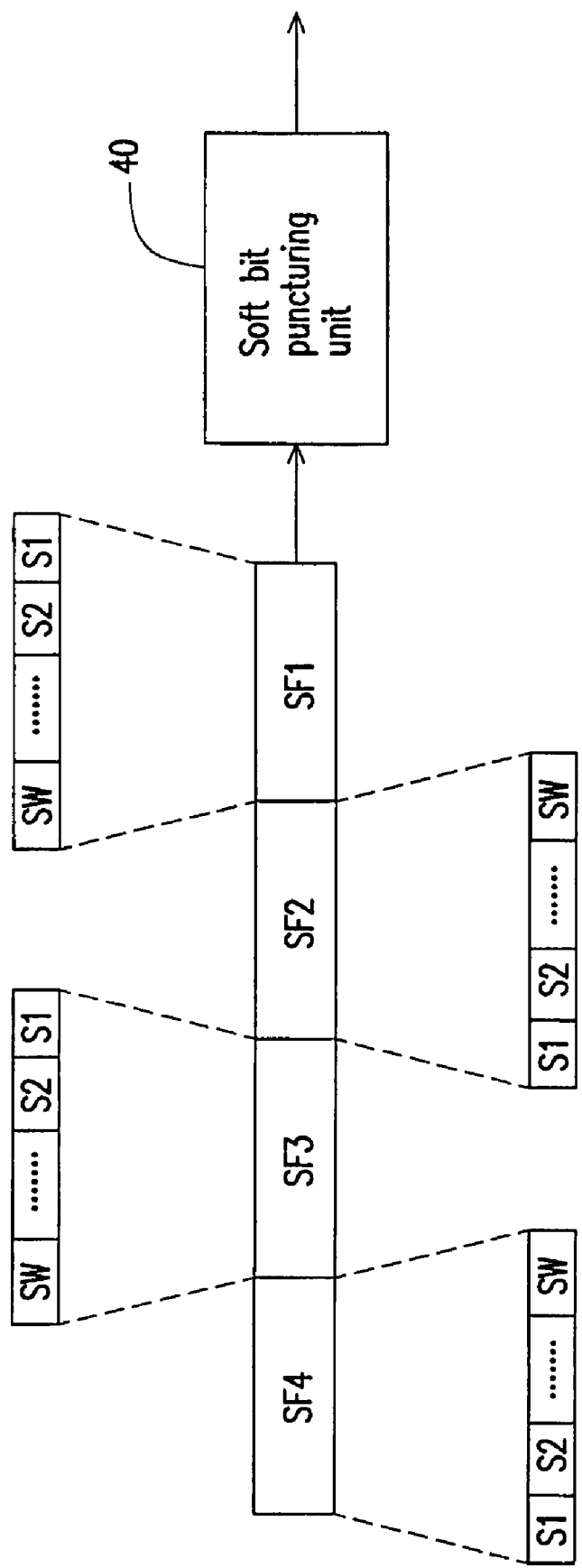
FIG. 4 is a circuit diagram illustrating an application of data switching method of the present invention for unequal error protection according to an embodiment of the present invention.

FIG. 4 is a circuit diagram illustrating an application of data switching method of the present invention for unequal error protection according to an embodiment of the present invention. Referring to FIG. 4, a continuous data is divided into four sequence codes SF1, SF2, SF3 and SF4, wherein each of the sequence codes SF1~SF4 represents for example, a super frame. Each of the sequence codes SF1~SF4 includes a plurality of transmitting data S1, S2 . . . SW, and each of the transmitting data S1~SW represents a frame. A soft bit puncturing unit 40 encodes each frame S1~SW and then punctures the each encoded frame to achieve an unequal error protection (UEP) effect, wherein each of the frames S1~SW requires a different bit error rate (BER). Assuming a relation of the BERs of the frames S1~SW within each of the super frames SF1~SF4 is PS1>PS2 . . . >PSW.

First, the four super frames SF1~SF4 are divided into a plurality of even super frames SF2 and SF4 and a plurality of odd super frames SF1 and SF3. Next, the frames S1~SW included in each odd super frame SF1 and SF3 are sorted by corresponding required BER of each frame decreasingly; and the frames S1~SW included in each even super frame SF2 and SF4 are sorted by the required BER of each frame increasingly. Finally, these sorted super frames are encoded and punctured by the soft bit puncturing unit 40.

Different from a conventional multiplexing method, it is unnecessary for the multiplexing method of the present invention to add a string of bit codes padded with zeros to the tail of each of the frames S1~SW to satisfy a requirement of an encoder and puncturing tables, such that the waste of bandwidth can be avoided. Moreover, utilization of a soft puncturing method by the soft bit puncturing unit 40 may avoid unexpected errors occurred due to excessive sudden changes of the BERs when performing decoding on the frames between two adjacent sequence codes (super frames) at a receiving terminal. Therefore, the multiplexing method of the present invention has a better error protection effect (i.e. may reduce the occurrence of errors) and a better transmitting efficiency (i.e. no waste of the bandwidth) than that of the conventional multiplexing method.

Figure 5:
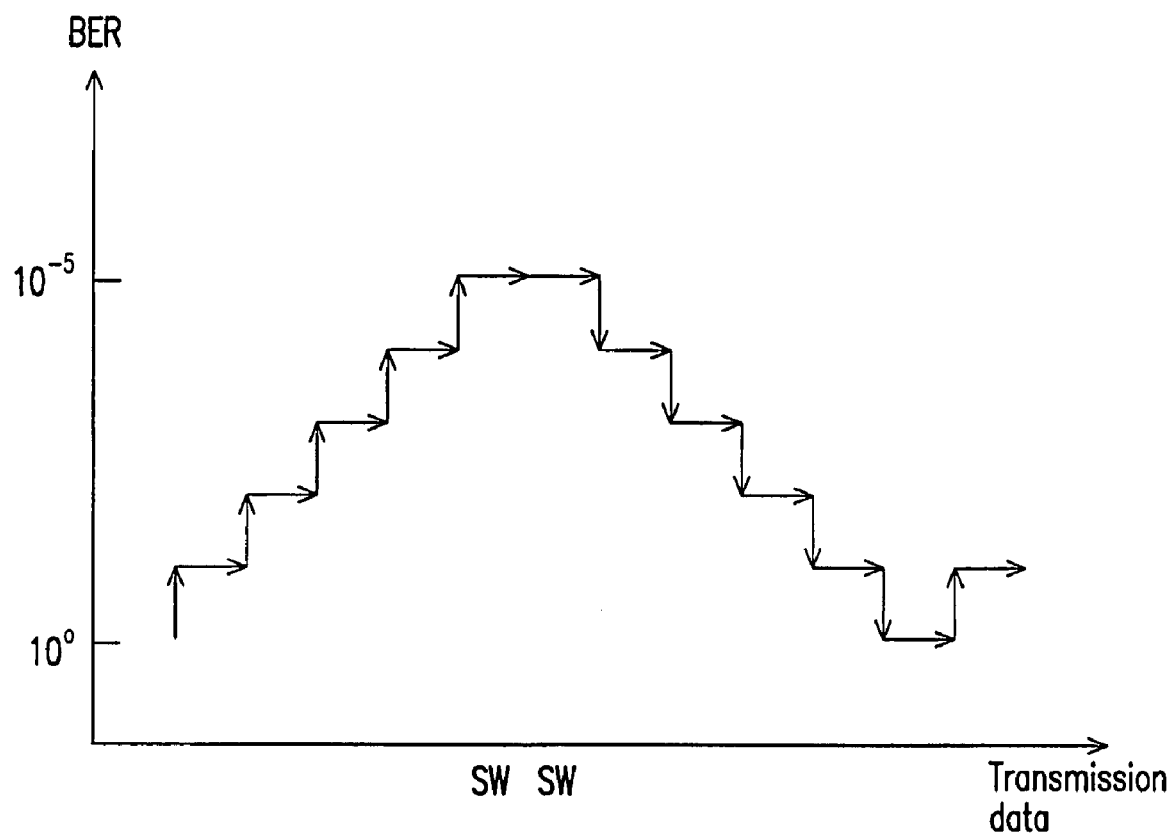
FIG. 5 is a schematic diagram of bit error rates on a receiving terminal according to a multiplexing method of the present invention for data switching.

FIG. 5 is a schematic diagram of bit error rates on a receiving terminal according to a multiplexing method of the present invention for data switching. Referring to FIG. 5, the BERs of the frames SW and SW closely connected between two adjacent super frames are properly arranged, such that the unexpected errors occurred in an UEP system can be avoided, and the error protection efficiency of the UEP system is improved.

Figure 6:
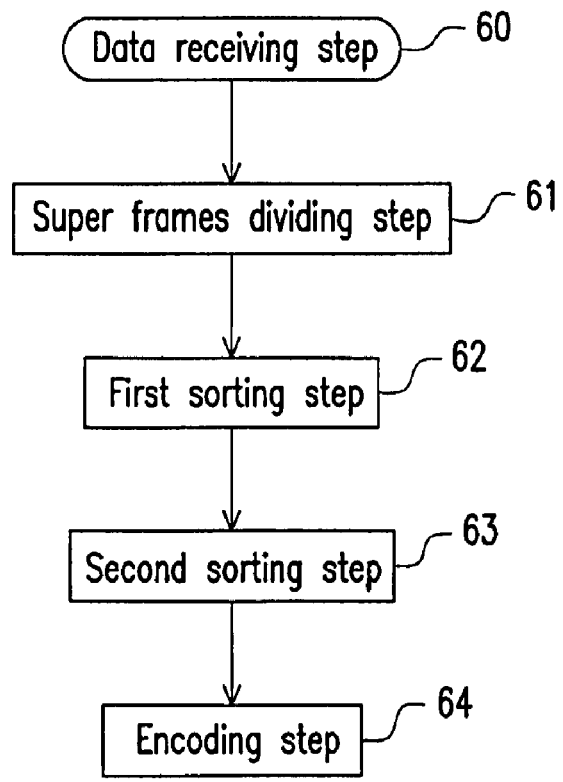
FIG. 6 is a flowchart illustrating a multiplexing method for data switching according to an embodiment of the present invention.

In summary, with reference of FIG. 6, the steps of the multiplexing method for data switching according to an embodiment of the present invention are described as follows. First, data receiving step 60, by which a continuous data including a plurality of super frames is received, wherein each of the super frames includes a plurality of frames. Second, super frames dividing step 61, by which the super frames are divided into a plurality of even super frames and a plurality of odd super frames. Third, first sorting step 62, by which the frames included in each odd super frame are sorted by corresponding required BER of each frame decreasingly or increasingly. Fourth, second sorting step 63, by which the frames included in each even super frame are sorted by the required BER of each frame increasingly or decreasingly. Finally, encoding step 64, by which an encoder is used to encode these sorted super frames.

In the above first sorting step 62, if the frames included in each odd super frame are sorted by corresponding required BER of each frame decreasingly, the frames included in each even super frame are then sorted by the required BER of each frame increasingly in the second sorting step 63. If the frames included in each odd super frame are sorted by corresponding required BER of each frame increasingly in the first sorting step 62, the frames included in each super frame are then sorted by the required BER of each frame decreasingly in the second sorting step 63. In other words, in the present invention, the BERs of the frames included in the super frames are not limited by sorting decreasingly first or increasingly first. Namely, if the frames included in a super frame are sorted according to the required BER of each frame decreasingly, the frames included in the two adjacent super frames are then sorted according to the required BER of each frame increasingly. Conversely, if the frames included in the super frame are sorted according to the required BER of each frame increasingly, the frames included in the two adjacent super frames are then sorted according to the required BER of each frame decreasingly.

The aforementioned multiplexing method may be applied to a plurality of systems requiring the UEP, for example, wireless LAN (WLAN), worldwide interoperability for microwave access (WiMAX), wideband code division multiple access (WCDMA), digital audio broadcast (DAB), digital video broadcasting (DVB) and real time multimedia network etc.

Figure 7:
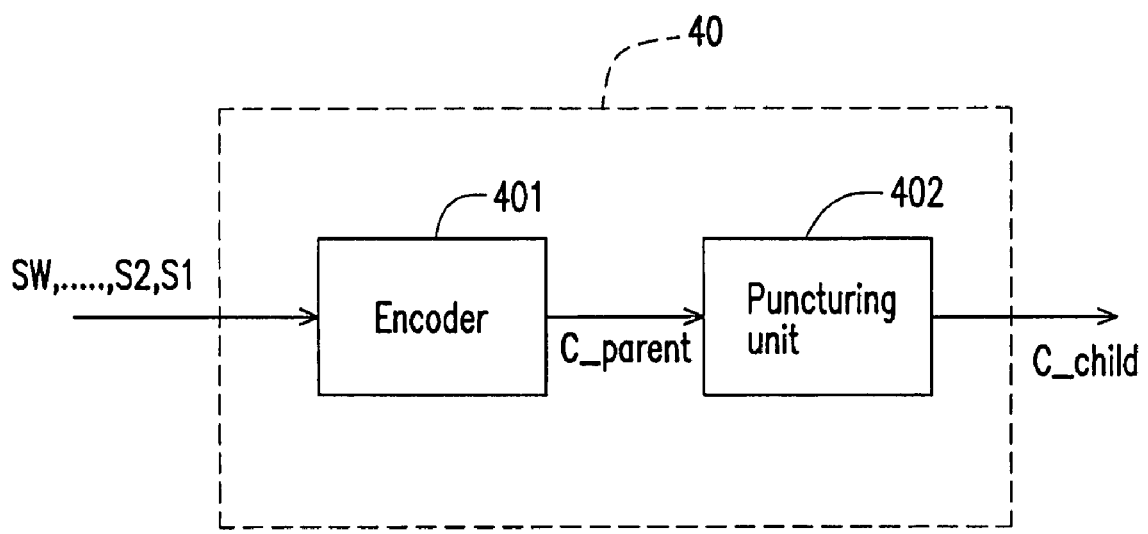
FIG. 7 is a circuit diagram of a soft bit puncturing unit using a data switching method of the present invention.

FIG. 7 is a circuit diagram of a soft bit puncturing unit 40 according to an embodiment of the present invention. Referring to FIG. 7, the soft bit puncturing unit 40 encodes and punctures the frames S1~SW requiring different BERs. The soft bit puncturing unit 40 includes an encoder 401 and a puncturing unit 402 coupled to the encoder 401. The encoder 401 may be a common used encoder which is not limited by the present invention. The encoder 401 encodes the inputted frames S1~SW and generates an encoded data C_parent. The puncturing unit 402 provides corresponding puncturing tables T1, T2 . . . TW to the inputted frames S1, S2 . . . SW, and punctures the encoded data C_parent according to the puncturing tables to generate a punctured encoded data C_child meeting the requirement of the coding rates. Different from a conventional hard switching method, the puncturing unit 402 applies a soft switching method to improve a hamming weight of the encoded data punctured by the puncturing unit 402, so as to improve the UEP efficiency. Owning to the utilization of the soft switching method by the puncturing unit 402, not only is the UEP efficiency improved, but also waste of the bandwidth and poor transmission rate due to utilization of the conventional hard switching method which trying to achieve a better UEP effect can be avoided. As described in the related art, to achieve the better UEP effect in the conventional hard switching method, a string of bit codes padded with zeros is added to the tail of the pre-encoded data to meet the requirement of bit length of an input bit. However, it will cause a waste of bandwidth. In summary, the data switching method and apparatus thereof provided by the present invention may avoid the waste of the bandwidth and achieve a good UEP effect.

Referring to FIG. 7 again, operation of the soft bit puncturing unit 40 will be described in detail as follows. The encoder 401 encodes the frames S1~SW and outputs the encoded data C_parent. Then, the puncturing unit 402 provides corresponding puncturing tables to the frames S1~SW requiring different BERs, and punctures the encoded data C_parent according to the puncturing tables to generate the punctured encoded data C_child.

A conventional method of generating the punctured encoded data C_child according to the encoded data C_parent is as follows. Assuming the frame S1 is provided, the encoder 401 encodes the frame S1 and generates the encoded data C_parent. The puncturing unit 402 provides a puncturing table T1 to the frame S1. Then, the puncturing unit 402 starts to puncture the encoded data C_parent according to the start position of the puncturing table T1 and outputs the punctured encoded data C_child. During which if the bit code located at a certain position of the puncturing table T1 is 1, the puncturing unit 402 then outputs the encoded data C_parent located in a position corresponding to that in the puncturing table T1. If the bit code located at a certain position of the puncturing table T1 is 0, the puncturing unit 402 then punctures the encoded data C_parent located in the position corresponding to that in the puncturing table T1. Assuming the encoded data of the frame S1 is C_parent=[1 0 1 1 1; 0 0 0 1 1], and the puncturing unit 402 provides the puncturing table T1=[0 0 0 1 1; 1 0 1 1 1] to the frame S1. Then, the puncturing unit 402 starts to puncture the encoded data C_parent according to the start position of the puncturing table T1, and generates the punctured encoded data C_child=[x x x 1 1; 0 x 0 1 1], wherein x represents the data punctured, i.e. x will not be transmitted. Therefore, according to the above example, the data outputted by the puncturing unit 102 is 110011.

To achieve the UEP effect, if the relation of the BERs required by the frames S1~SW is PS1>PS2 . . . >PSW, the puncturing unit 402 may sequentially provide the puncturing tables T1~TW to the corresponding frames S1~SW, wherein the relation of the puncturing tables T1~TW is described as follows. If the bit code located at a certain position of the puncturing table T1 is 1, the bit codes located at the same positions of the puncturing tables T2~TW are also 1. If the bit code located at a certain position in the puncturing table T2 is 1, the bit codes located at the same positions of the puncturing tables T3~TW are also 1. The relations of the other puncturing tables may be deduced accordingly. For example, if the bit code located at a first column and a second row of the puncturing table T1 is 1, the bit code located at the first column and the second row of each of the puncturing tables T2~TW is also 1. According to the aforementioned relation of the puncturing tables T1~TW, the number of bits punctured in the frames S1~SW has a relation of S1>S2> . . . >SW. Namely, protection degrees of the frames S1~SW provided by the encoder 40 have an order of S1<S2< . . . <SW. According to the different protection degrees of the frames S1~SW protected by the encoder 40, the error correction ability provided by the encoder 40 may satisfy the requirement of different BERs for the frames S1~SW, such that the UEP can be achieved.

Referring to FIG. 7 again, an example is provided to explain the soft switching method of the puncturing unit 402. Assuming the encoded data of the frame S1 after being encoded by the encoder 401 is [1 0 1; 0 0 0], and the corresponding puncturing table T1 is [0 0 0 1 1; 1 0 1 1 1]; the encoded data of the frame S2 after being encoded by the encoder 401 is [1 1 1 0 1 1; 1 1 0 0 0 1 1], and the corresponding puncturing table T2 is [0 0 1 1 1; 1 0 1 1 1]. The encoded data of the frames S1 and S2 after being encoded by the encoder 401 is C_parent=[1 0 1 1 1 1 0 1 1 1; 0 0 0 1 1 0 0 1 1]. Then, the puncturing unit 402 starts to puncture the data located at 0~2 columns of the encoded data C_parent according to the start position of the puncturing table T1. Namely, 0~2 columns of the encoded data C_parent are punctured according to 0~2 columns of the puncturing table T1. In this case, the puncturing unit 402 records the third column of the puncturing table T1 as a reference position of the puncturing table T2. The puncturing unit 402 then starts to puncture the data located at 3~9 columns of the encoded data C_parent according to the reference position of the puncturing table T2. However, the 3~9 columns of the encoded data C_parent include more columns than that included in the puncturing table T2. Therefore, the puncturing process is also started according to the reference position of the puncturing table T2, until the end position of the puncturing table T2. In this case, some bits of the encoded data C_parent will be left un-punctured. Then, the puncturing process is restarted according to the start position of the puncturing table T2 until puncturing of the C_parent is completed. In other words, the puncturing unit 402 first punctures the data located at 3~4 columns of the encoded data C_parent according to the data located at 3~4 columns of the puncturing table T2. Then, the data located at 5~9 columns of the encoded data C_parent are punctured according to the data located at 0~4 columns of the puncturing table T2. Finally, the puncturing unit 402 generates the punctured encoded data C_child=[x x x 11 x x 1 1 1; 0 x 0 1 1 0 x 0 1 1]. In this case, the hamming weight of the punctured encoded data C_child is 9, which is better than the hamming weight 4 of the conventional hard switching method. Therefore, variation of the hamming weight is little due to utilization of the soft switching method by the encoder 40, and the UEP efficiency of the soft switching method is better than that of the conventional hard switching method.

In addition, another example is provided to explain the soft switching method. Assuming the encoded data of the frame S1 after being encoded by the encoder 401 is [1 0 1 1 1; 0 0 0 1 1], and the corresponding puncturing table T1 is [0 0 0 1 1; 1 0 1 1 1]; the encoded data of the frame S2 after being encoded by the encoder 401 is [1 0 1 1 1 0 0; 0 0 0 1 1 1 0], and the corresponding puncturing table T2 is [0 0 1 1 1; 1 0 1 1 1]; the encoded data of the frame S3 after being encoded by the encoder 401 is [0 1 1 1 0; 0 0 1 1 1], and the corresponding puncturing table T3 is [1 0 1 1 1; 1 0 1 1 1]. The encoded data of the frames S1~S3 after being encoded by the encoder 401 is C_parent=[1 0 1 1 1 1 0 1 1 1 0 0 0 1 1 1 0; 0 0 0 1 1 0 0 0 1 1 1 0 0 0 1 1 1].

In this case, the puncturing unit 402 starts to puncture the data located at 0~4 columns of the encoded data C_parent according to the start position of the puncturing table T1. Namely, 0~4 columns of the encoded data C_parent are punctured according to 0~4 columns of the puncturing table T1. Then, the puncturing unit 402 records the start position of the puncturing table T2 as the reference position of the puncturing table T2. The puncturing unit 402 then punctures the data located at 5~11 columns of the encoded data C_parent according to the reference position of the puncturing table T2. However, the 5~11 columns of the encoded data C_parent include more columns than that included in the puncturing table T2. Therefore, the puncturing process is also started according to the reference position of the puncturing table T2, until the end position of the puncturing table T2. In this case, some bits of the encoded data C_parent will be left un-punctured. Then, the puncturing process is restarted according to the start position of the puncturing table T2 until puncturing of the C_parent is completed. In other words, the puncturing unit 402 first punctures the data located at 5~9 columns of the encoded data C_parent according to the data located at 0~4 columns of the puncturing table T2. Then, the data located at 1 0~1 1 columns of the encoded data C_parent are punctured according to the data located at 0~1 columns of the puncturing table T2. Now, the puncturing unit 402 records the second column of the puncturing table T2 as the reference position of the puncturing table T3.

Then, the puncturing unit 402 punctures the data located at 12~16 columns of the encoded data C_parent according to the reference position of the puncturing table T3. The puncturing process is also started according to the reference position of the puncturing table T3, until the end position of the puncturing table T3. In this case, some bits of the encoded data C_parent will be left un-punctured. Then, the puncturing process is restarted according to the start position of the puncturing table T3 until puncturing of the C_parent is completed. In other words, the puncturing unit 402 first punctures the data located at 12~14 columns of the encoded data C_parent according to the data located at 2~4 columns of the puncturing table T3. Then, the data located at 15~16 columns of the encoded data C_parent are punctured according to the data located at 0~1 columns of the puncturing table T3. Finally, the punctured encoded data generated by the puncturing unit 402 is C_child=[x x x 1 1 x x 1 1 1 x x 0 1 1 1 x; 0 x 0 1 1 0 x 0 1 1 1 x 0 0 1 1 x].

Up to three frames are employed to explain the soft switching method in the aforementioned examples. If the inputted frames are more than three, operation of the soft switching method and apparatus thereof can be deduced based on the aforementioned examples.

Therefore, based on the aforementioned description, the algorithm of the soft switching method may be represented by:

C_parent$_{i,t}$ is allowed for transmission as $T_{i, t\ mod\ p}(k)=1$;
C_parent$_{i,t}$ is deleted from encoder outputs as $T_{i, t\ mod\ p}(k)=0$;

for any t in the range between tk and tk'

Wherein tk represents the end position of a (k−1)-th puncturing table plus 1. $T_{ij}(k)$ represents the bit code located at i-th row and j-th column in a k-th puncturing table, and the number of the total columns of the k-th puncturing table is p. tk' represents a k-th frame is ended on a tk'-th column of the C_parent. C_parent$_{i,t}$ represents the encoded data located at the i-th row and t-th colomn. If the bit code located at the i-th row and (t mod p)-th column of the puncturing table is 1, data located at i-th row and t-th column of the encoded data C_parent can be transmitted. If the bit code located at the i-th row and (t mod p)-th column of the puncturing table is 0, data located at i-th row and t-th column of the encoded data C_parent is punctured.

Figure 8:
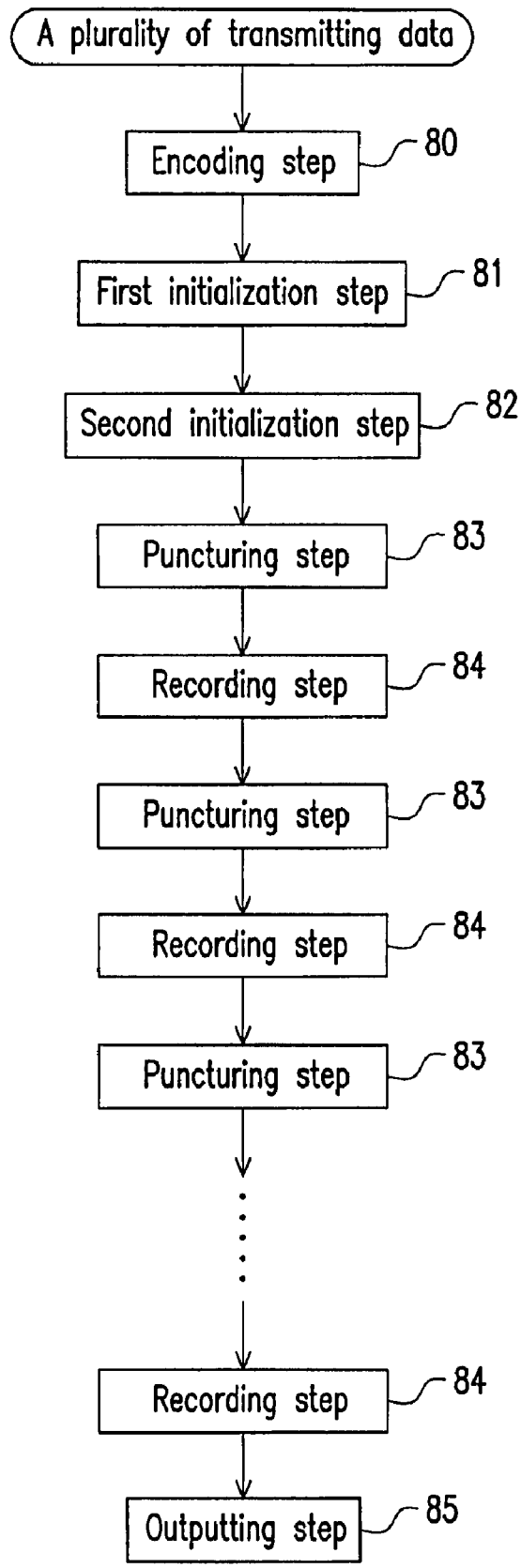
FIG. 8 is a flowchart illustrating a data switching method according to an embodiment of the present invention.

FIG. 8 is a flowchart illustrating a data switching method according to an embodiment of the present invention. Referring to FIG. 8 and the aforementioned embodiment, first, the encoding step 80, by which a plurality of frames is encoded by the encoder 401. Second, the first initialization step 81, by which a plurality of puncturing tables are provided, and the start position and the end position of each puncturing table are recorded for processing the corresponding encoded frame, wherein each puncturing table includes a plurality of bit codes. Third, the second initialization step 82, by which the start position of the first puncturing table is recorded as the reference position of the first puncturing table. Fourth, the puncturing step 83, by which the k-th frame is punctured according to the k-th puncturing table, and the puncturing process is started according to the reference position of the k-th puncturing table until the end position of the k-th puncturing table, and if there are still some bits of the k-th frame left un-punctured, the puncturing process is restarted according to the start position of the k-th puncturing table until puncturing of the k-th frame is completed. Fifth, recording step 84, by which the reference position of the (k+1)-th puncturing table is recorded, and when puncturing process of the k-th frame is completed, the present position of the k-th puncturing table is judged whether to be the end position of the k-th puncturing table or not. If not, the position of the bit code in the puncturing table where puncturing of the k-th frame being completed plus 1 is recorded as the reference position of the (k+1)-th puncturing table. If yes, the start position of the (k+1)-th puncturing table is recorded as the reference position of the (k+1)-th puncturing table.

The above puncturing step 83 and recording step 84 are repeatedly performed until puncturing of the frames is completed. The last step is outputting step 85, by which the punctured encoded data is outputted.

The encoder 401 used in the encoding step 80 of the above-described data switching method may be a convolution code encoder, a turbo code encoder or a low-density parity-check (LDPC) encoder. The puncturing tables of the above-described data switching method can be stored in a memory device, which may be a non-volatile memory device. For example, read only memory (ROM) or flash etc.

In the above data switching method, if there are only two frames provided, the second frame may be a data having more significance than that of the first frame. For example, during a video transmission, the first frame may be a motion imaging vector data, and the second frame may be a static image data. During an image transmission, the first frame may be a plurality of data having the least significant bits (LSB) in an image data, and the second frame may be a plurality of data having the most significant bits (MSB) in an image data. In addition, during an image and audio transmission, since the bit error rate required by the audio data is smaller than that required by the image data, the first frame may be the audio data, and the second frame may be the image data.

Figure 9:
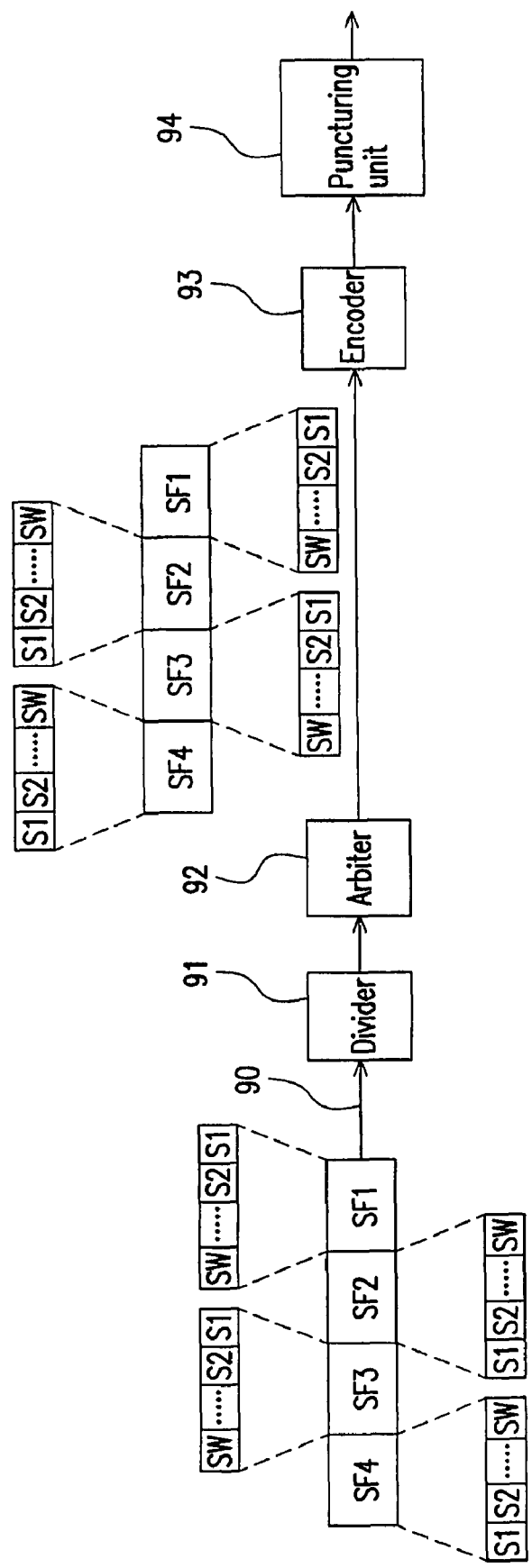
FIG. 9 is a circuit diagram of a multiplexing apparatus for data switching according to an embodiment of the present invention.

FIG. 9 is a circuit diagram of a multiplexing apparatus for data switching according to an embodiment of the present invention. Referring to FIG. 9, the multiplexing apparatus includes an input terminal 90, a divider 91, an arbiter 92 and an encoder 93. The divider 91 is coupled to the input terminal 90, the arbiter 92 is coupled to the divider 91, and the encoder 93 is coupled to the arbiter 92. The input terminal is used for inputting a continuous data including the plurality of super frames SF1~SF4, wherein each of the super frames SF1~SF4 includes a plurality of frames S1~SW. The relation of the BERs required by the frames S1~SW is PS1>PS2> . . . >PSW.

The divider 91 is used for dividing the plurality of super frames into a plurality of odd super frames SF1, SF3 and a plurality of even super frames SF2, SF4. The frames S1~SW included in each odd super frame SF1 and SF3 are sorted by the arbiter 92 according to the corresponding required BER of each frame decreasingly. The frames S1~SW included in each even super frame SF2 and SF4 are sorted by the arbiter 92 according to the required BER of each frame increasingly (the sorting result is shown as an output of the arbiter 92 in FIG. 9). The encoder 93 is then used to encode these sorted super frames SF1~SFW.

The sorting method of the arbiter 92 may also be as follows. The frames S1~SW included in each odd super frame SF1 and SF3 are sorted according to the required BER of each frame increasingly, and the frames S1~SW included in each even super frame SF2 and SF4 are sorted according to the required BER of each frame decreasingly. In other words, in the present multiplexing apparatus, sorting of the frames included each odd super frames is not limited by sorting the required BER of each frame decreasingly first or increasingly first.

Referring to FIG. 9 again, the multiplexing apparatus further includes a puncturing unit 94 coupled to the encoder 93.

The puncturing unit 94 is used for puncturing the encoded frames and recording positions. The puncturing unit 94 further includes a plurality of puncturing tables providing the start and end positions for the puncturing unit 94 to record. The puncturing unit 94 punctures the encoded frames according to the puncturing tables. Each of the puncturing tables includes a plurality of the bit codes. The puncturing unit 94 may record the start position of the first puncturing table as the reference position of the first puncturing table.

The puncturing unit 94 may puncture the k-th frame according to the k-th puncturing table, and puncturing of the k-th frame is started according to the reference position of the k-th puncturing table until the end position of the k-th puncturing table, and if there are still some bits of the k-th frame left un-punctured, the puncturing process is restarted according to the start position of the k-th puncturing table until puncturing of the k-th frame is completed. When puncturing process of the k-th frame according to the k-th puncturing table is completed, the puncturing unit 94 judges whether the present position of the k-th puncturing table is the end position of the k-th puncturing table or not. If not, the position of the bit code in the puncturing table where puncturing of the k-th frame being completed plus 1 is recorded as the reference position of the (k+1)-th puncturing table. If yes, the start position of the (k+1)-th puncturing table is recorded as the reference position of the (k+1)-th puncturing table. When the frames are all punctured, the puncturing unit 94 outputs the punctured encoded data.

The aforementioned multiplexing apparatus for data switching may be applied to a plurality of communication standards and network systems, for example, WLAN, WiMAX, WCDMA, DAB, DVB and real time multimedia network etc.

The encoder 93 used in the aforementioned multiplexing apparatus may be a convolution code encoder, a turbo code encoder or a LDPC encoder. The puncturing tables of the aforementioned multiplexing apparatus can be stored in a memory device, which may be a non-volatile memory device. For example, ROM or flash etc.

In summary, application of the data multiplexing method and apparatus of the present invention has the following advantages. Great variation of the BERs of the frames located between two adjacent super frames is avoided, and therefore unexpected errors occurred in the system is mitigated. The rate-compatible punctured code encoder applying the soft switching method may avoid the problem of excessive decrease of hamming weight which usually happens when the conventional hard switching method is applied, such that a better UEP effect is achieve.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multiplexing method for data switching, the method comprising:
   inputting a continuous data including a plurality of super frames, wherein each of the super frames includes a plurality of frames;
   dividing the super frames into a plurality of odd super frames and a plurality of even super frames;
   sorting the frames included in each odd super frame by corresponding required bit error rate (BER) of each frame decreasingly or increasingly;
   sorting the frames included in each even super frame by corresponding required BER of each frame increasingly or decreasingly; and
   encoding the sorted super frames via an encoder.

2. The multiplexing method for data switching as claimed in claim 1, wherein if the frames included in each odd super frame are sorted by corresponding required BER of each frame decreasingly, the frames included in each even super frame are then sorted by the required BER of each frame increasingly; and if the frames included in each odd super frame are sorted by corresponding required BER of each frame increasingly, the frames included in each even super frame are then sorted by the required BER of each frame decreasingly.

3. The multiplexing method for data switching as claimed in claim 2, wherein the method is applied to wireless LAN (WLAN), worldwide interoperability for microwave access (WiMAX), wideband code division multiple access (WCDMA), digital audio broadcast (DAB), digital video broadcasting (DVB) and real time multimedia network etc.

4. A multiplexing apparatus for data switching, the apparatus comprising:
   an input terminal, for inputting a continuous data including a plurality of super frames, wherein each super frame includes a plurality of frames;
   a divider, for dividing the super frames into a plurality of odd super frames and a plurality of even super frames; and
   an arbiter, for sorting the frames included in each odd super frame by corresponding required BER of each frame decreasingly or increasingly, and sorting the frames included in each even super frame by corresponding required BER of each frame increasingly or decreasingly.

5. The multiplexing apparatus for data switching as claimed in claim 4, wherein if the frames included in each odd super frame are sorted by corresponding required BER of each frame decreasingly, the frames included in each even super frame are then sorted by the required BER of each frame increasingly, and if the frames included in each odd super frame are sorted by corresponding required BER of each frame increasingly, the frames included in each even super frame are then sorted by the required BER of each frame decreasingly.

6. The multiplexing apparatus for data switching as claimed in claim 5 further comprising:
   an encoder, used for encoding a plurality of transmitting data sorted by the multiplexing apparatus;
   a puncturing unit, for puncturing the frames encoded by the encoder to meet requirements of different coding rates.

7. The multiplexing apparatus for data switching as claimed in claim 6, wherein the puncturing unit further comprises:
   a plurality of puncturing tables, for providing a start position and an end position of each puncturing table for the puncturing unit to record, and the puncturing unit punctures the encoded frames according to the puncturing tables, wherein each puncturing table includes a plurality of bit codes;
   wherein the puncturing unit records the start position of the first puncturing table as the reference position of the first puncturing table; and
   a k-th frame is punctured according to a k-th puncturing table, puncturing of the k-th frame is started according to the reference position of the k-th puncturing table until the end position of the k-th puncturing table, and if there are still some bits of the k-th frame left un-punctured, the puncturing process is restarted according to the start position of the k-th puncturing table until puncturing of the k-th frame is completed, and when the puncturing process of the k-th frame is completed, a present position of the k-th puncturing table is judged whether to be the end position of the k-th puncturing table or not, if not, the position of a bit code in the puncturing table where puncturing of the k-th frame being completed plus 1 is recorded as the reference position of a (k+1)-th puncturing table, and if yes, the start position of the (k+1)-th puncturing table is recorded as the reference position of the (k+1)-th puncturing table.

8. The multiplexing apparatus for data switching as claimed in claim 7, wherein the multiplexing apparatus is applied to WLAN, WiMAX, WCDMA, DAB, DVB and real time multimedia network etc.

9. The multiplexing apparatus for data switching as claimed in claim 7, wherein the second frame is a data having more significance than that of the first frame.

10. The multiplexing apparatus for data switching as claimed in claim 9, wherein the first frame is a motion imaging vector data, and the second frame is a static image data.

11. The multiplexing apparatus for data switching as claimed in claim 9, wherein the first frame is a plurality of data having the least significant bits (LSB) in an image data, and the second frame is a plurality of data having the most significant bits (MSB) in an image data.

12. The multiplexing apparatus for data switching as claimed in claim 7, wherein the first frame is an audio data, and the second frame is an image data.

13. The multiplexing apparatus for data switching as claimed in claim 7, wherein the puncturing tables are stored in a memory device.

14. The multiplexing apparatus for data switching as claimed in claim 13, wherein the memory device comprises a non-volatile memory device.

15. The multiplexing apparatus for data switching as claimed in claim 6, wherein the encoder comprises a convolution code encoder.

16. The multiplexing apparatus for data switching as claimed in claim 6, wherein the encoder comprises a turbo code encoder.

17. The multiplexing apparatus for data switching as claimed in claim 6, wherein the encoder comprises a LDPC encoder.

* * * * *

UNITED STATES PATENT AND TRADEMARK OFFICE
CERTIFICATE OF CORRECTION

PATENT NO.        : 8,060,796 B2
APPLICATION NO.   : 11/864992
DATED             : November 15, 2011
INVENTOR(S)       : Wang et al.

It is certified that error appears in the above-identified patent and that said Letters Patent is hereby corrected as shown below:

On the Title page of the patent grant, please replace item (73) Assignee's Name with Industrial Technology Research Institute, Hsinchu (TW)
    National Chiao Tung University, Hsinchu (TW)

Signed and Sealed this
Sixth Day of March, 2012

David J. Kappos
*Director of the United States Patent and Trademark Office*